(12) United States Patent
Nemoto et al.

(10) Patent No.: US 6,670,650 B2
(45) Date of Patent: Dec. 30, 2003

(54) POWER SEMICONDUCTOR RECTIFIER WITH RING-SHAPED TRENCHES

(75) Inventors: Michio Nemoto, Nagano (JP); Tatsuya Naito, Nagano (JP); Masahito Otsuki, Nagano (JP); Mitsuaki Kirisawa, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/210,874

(22) Filed: Aug. 2, 2002

(65) Prior Publication Data

US 2003/0052383 A1 Mar. 20, 2003

(30) Foreign Application Priority Data

Aug. 2, 2001 (JP) ........................................ 2001-234320

(51) Int. Cl.$^7$ .............................................. H01L 29/74
(52) U.S. Cl. ...................... 257/144; 257/471; 257/473; 257/478; 257/479
(58) Field of Search ................ 257/471, 473, 257/478, 479, 144

(56) References Cited

U.S. PATENT DOCUMENTS 5,262,668 A * 11/1993 Tu et al.

FOREIGN PATENT DOCUMENTS

| JP | 30-031271 | 2/1985 |
|----|-----------|--------|
| JP | 05-063184 | 3/1993 |
| JP | 05-110062 | 4/1993 |
| JP | 05-226638 | 9/1993 |

* cited by examiner

Primary Examiner—Fetsum Abraham

(57) ABSTRACT

A high-speed, soft-recovery semiconductor device that reduces leakage current by increasing the Schottky ratio of Schottky contacts to pn junctions. In one embodiment of the present invention, an $n^-$ drift layer is formed on an $n^+$ cathode layer 1 by epitaxial growth, and ring-shaped ring trenches having a prescribed width are formed in the $n^-$ drift layer. Oxide films are formed on the side walls of each ring trench. The ring trenches are arranged such that the centers of the rings of the ring trenches adjacent to one another form a triangular lattice unit. A $p^-$ anode layer is formed at the bottom of each ring trench. Schottky contacts are formed at the interface between an anode electrode and the surface of the $n^-$ drift layer. Ohmic contact is established between the surfaces of polysilicon portions and the anode electrode.

25 Claims, 11 Drawing Sheets

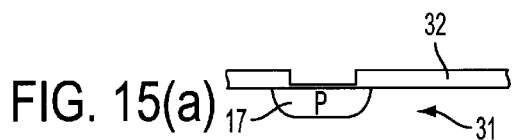
FIG. 15(a)
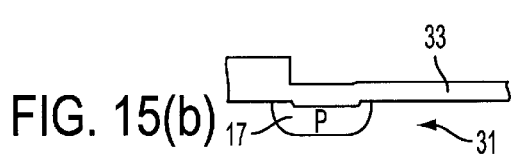
FIG. 15(b)
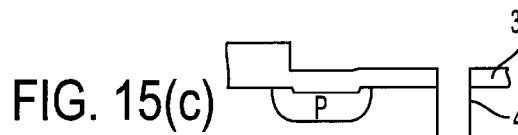
FIG. 15(c)
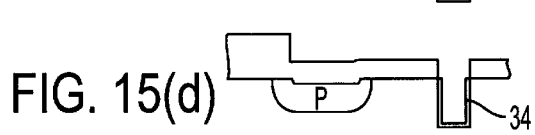
FIG. 15(d)
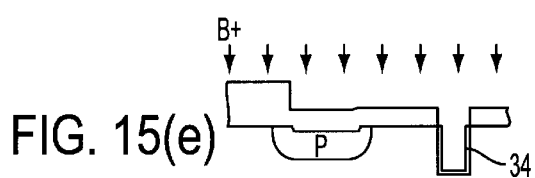
FIG. 15(e)
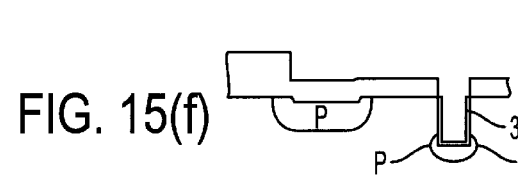
FIG. 15(f)
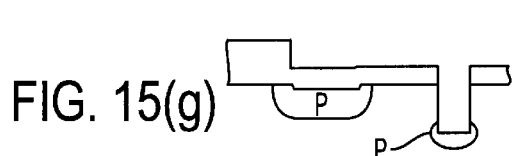
FIG. 15(g)
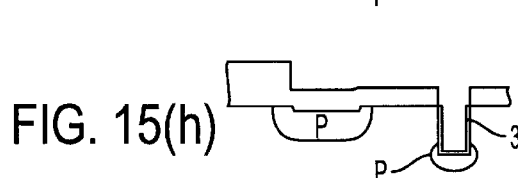
FIG. 15(h)
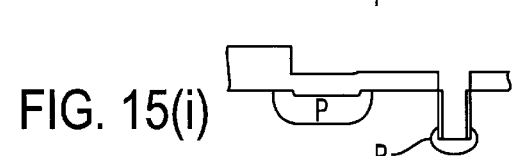
FIG. 15(i)
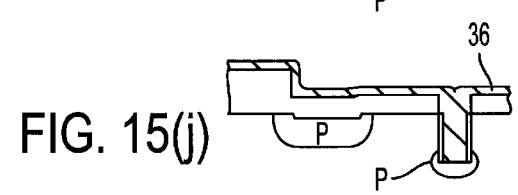
FIG. 15(j)
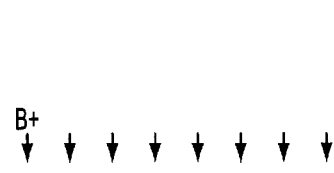
FIG. 15(k)
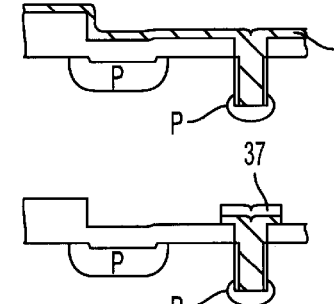
FIG. 15(l)
FIG. 15(m)
FIG. 15(n)
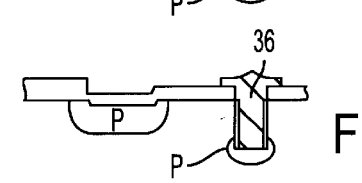
FIG. 15(o)
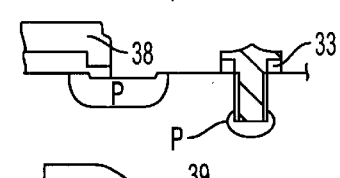
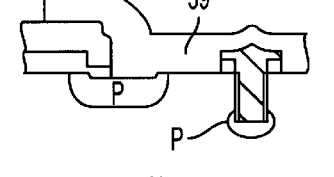
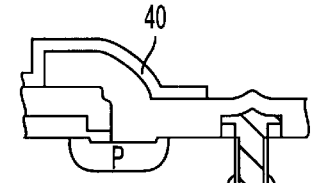
FIG. 15(p)

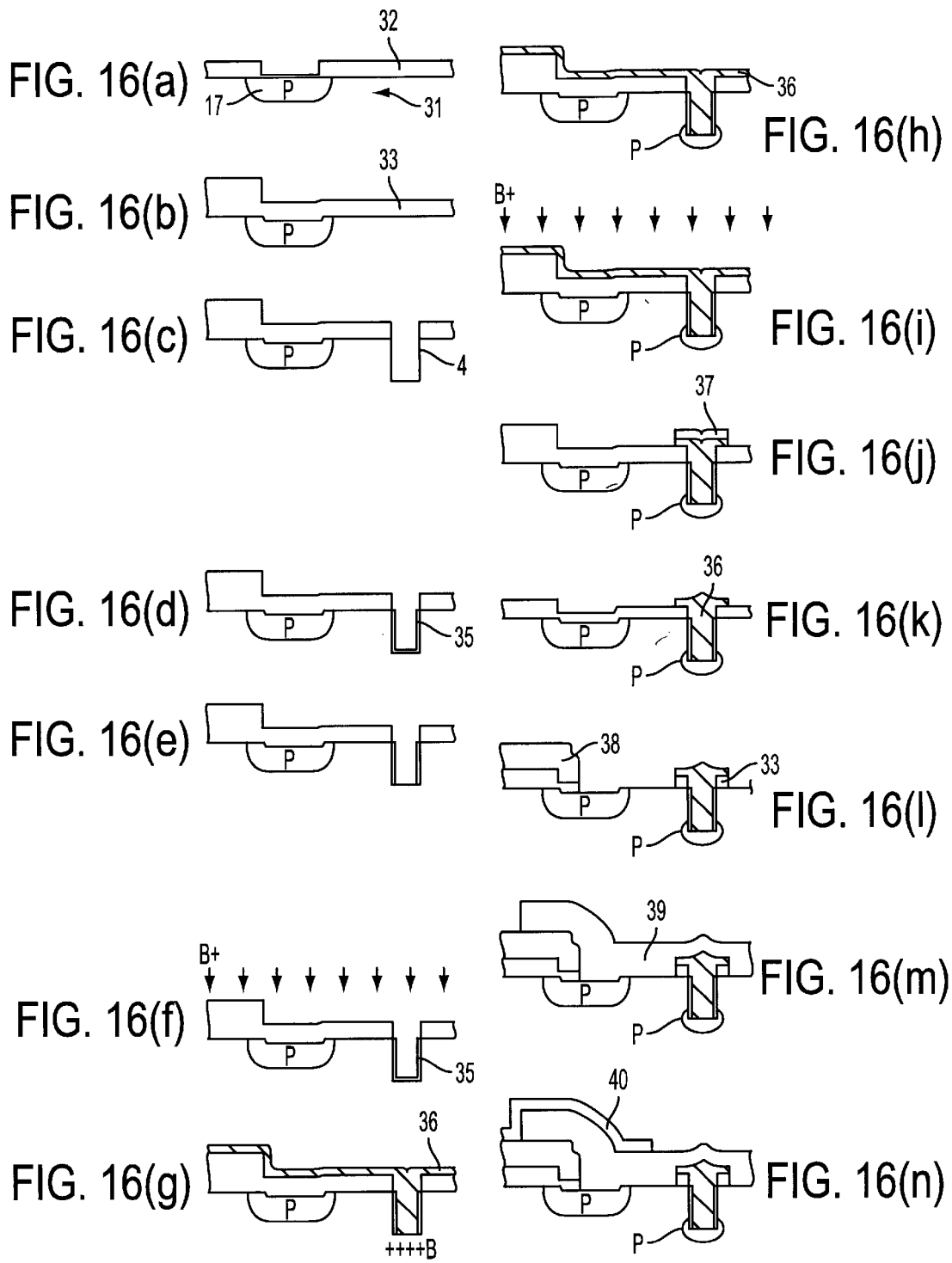

POWER SEMICONDUCTOR RECTIFIER WITH RING-SHAPED TRENCHES

CROSS REFERENCE TO RELATED APPLICATIONS

This application is based on, and claims priority to, JP PA 2001-234320 filed Aug. 2, 2001, the contents of which are incorporated by reference. This application is also related to JP PA 2002-198186 filed Jul. 8, 2002, the contents of which are incorporated by reference.

BACKGROUND OF THE INVENTION

1. Field of the Invention

The present invention relates to a semiconductor device such as a power semiconductor rectifier (power diode).

2. Description of the Related Art

Power diodes are used for various purposes. In recent years, power diodes have been used in inverter circuits, etc., that operate at relatively high frequencies of several kilohertz to tens of kilohertz. Power diodes used for such high-frequency operation are strongly required to have high switching speeds. Conventionally, pn diodes are mainly used as power diodes. Maintaining a necessary breakdown voltage using pn junctions, pn diodes have a smaller leakage current than Schottky diodes that maintain a necessary breakdown voltage using Schottky contacts. However, in pn diodes, too many minority carriers are accumulated in an n-type base layer during on-operation and, hence, it is necessary to sweep out accumulated carriers in a reverse recovery operation. Because the carrier sweeping-out takes time, the switching speed of pn diodes is low. To increase the switching speed (i.e., to increase the device operation speed), lifetime killers are introduced into the n-type base layer by diffusion of atoms of a heavy metal, such as gold or platinum, or by electron beam irradiation.

In recent years, power semiconductor rectifiers having an MPS (merged pin/Schottky diode) structure have been disclosed in which pn diodes and Schottky diodes are provided in parallel in a single chip. A planar-type MPS diode disclosed in Japanese Laid-Open Patent Application No. 31271/1985 has a large leakage current because the electric field strength cannot be made sufficiently low at the Schottky contacts. To solve this problem, structures in which trenches are formed have pn junctions formed at the bottoms of the trenches and, if necessary, at the side surfaces of the trenches. In these structures, Schottky contacts are formed on the surfaces of portions interposed between the trenches, as disclosed in Japanese Laid-Open Patent Application Numbers 63184/1993, 110062/1993, and 226638/1993. In a plan view, the trenches usually assume dot shapes (see FIG. 17(a)), and in some cases, the trenches assume striped shapes (see FIG. 17(b)).

Because there are no curved portions in the case of striped-shape trenches, the electric field strength in the p-type layers at the bottoms of the trenches in the active portion can be made lower than in the case of dot-shaped trenches if the ratio of Schottky contacts to pn junctions is small. On the other hand, if the Schottky ratio is increased, the depletion layer pinch-off effect between the trenches diminishes and, hence, the electric field strength increases in the p-type layers and in the Schottky contact portions, which results in a reduction in breakdown voltage and an increase in leakage current.

In the case of dot-shaped trenches, if the Schottky ratios are the same, the cell pitch (interval) can be made smaller and, hence, the leakage current can be made smaller than the leakage current in the case of striped trenches. However, if the semiconductor device is miniaturized by decreasing the cell pitch, the dot diameter decreases. As the dot diameter decreases, the curvature of p-type layers at the bottoms of the trenches increases, making maintenance of a high breakdown voltage more difficult.

As the openings of the dot-shaped trenches are made smaller, cavities become more prone to be formed when the trenches are filled with polysilicon. Therefore, with the dot-shaped trenches, it is difficult to increase the Schottky area ratio (about 90% or more) while keeping the leakage current small (i.e., while maintaining a high breakdown voltage).

SUMMARY OF THE INVENTION

An object of the present invention is to solve the above problems, thereby providing a high-speed, soft-recovery semiconductor device with an increased ratio of Schottky contacts to pn junctions and that does not have a reduction in breakdown voltage.

To attain the above object according to one aspect of the present invention, in a semiconductor device having an anode electrode that is formed on a first major surface of a semiconductor substrate having a first conductivity type, Schottky contacts are formed such that the anode electrode is selectively in Schottky contact with the semiconductor substrate, a cathode region is formed on a surface layer of a second major surface of the semiconductor substrate, and a cathode electrode is formed on the cathode region. A plurality of Schottky contacts are formed, and each of the Schottky contacts assumes, in the first major surface, a plan shape of a circle or a polygon whose apices are arranged on the circumference of a circle, with straight lines connecting the centers of the circles or the polygons adjacent to each other to form a triangular lattice unit.

Ring-shaped trenches having a prescribed width are formed in a surface layer of the first major surface of the semiconductor substrate. First Schottky contacts are formed such that the anode electrode is in Schottky contact with portions of the semiconductor substrate that are located inside the trenches, and second Schottky contacts are formed such that the anode electrode is in Schottky contact with portions of the semiconductor substrate that are located outside the trenches.

In another aspect of the present invention, the semiconductor device comprises insulating films that are formed on side walls of the trenches, first semiconductor regions having a second conductivity type that are formed to be in contact with the bottoms of the trenches, and conductive materials that fill the trenches and electrically connect the first semiconductor regions to the anode electrode.

In a further aspect of the present invention, the semiconductor device comprises insulating films that are formed on the side walls and bottoms of the trenches and conductive materials that fill the trenches and are electrically connected to the anode electrode.

In a further aspect of the present invention, in a surface layer of the semiconductor substrate, ring-shaped second semiconductor regions having a prescribed width and a second conductivity type are formed. First Schottky contacts are formed such that the anode electrode is in Schottky contact with portions of the semiconductor substrate that are located inside internal circles of the second semiconductor regions, and second Schottky contacts are formed such that the anode electrode is in Schottky contact with portions of the semiconductor substrate that are located outside outer circles of the second semiconductor regions. The first Schottky contacts have a plan shape of a circle or a polygon whose apices are arranged on the circumference of a circle.

In a further aspect of the present invention, third semiconductor regions having a second conductivity type are formed on side walls and bottoms of the trenches, and conductive materials fill the trenches and are electrically connected to the anode electrode.

In a further aspect of the present invention, a semiconductor device comprises an anode electrode formed on one surface of a semiconductor substrate. A plurality of ring-shaped trenches are formed in the one surface of the semiconductor substrate, wherein centers, on the one surface of the semiconductor substrate, of each of the trenches form vertices of a triangular lattice. A plurality of first Schottky contacts are formed between the anode electrode and portions of the semiconductor substrate located inside the trenches. A plurality of second Schottky contacts are formed between the anode electrode and portions of the semiconductor substrate located outside the trenches.

In a further aspect of the present invention, a method of forming a semiconductor device comprises forming an anode electrode on one surface of a semiconductor substrate and a plurality of ring-shaped trenches in the one surface of the semiconductor substrate. Centers, on the one surface of the semiconductor substrate, of each of the trenches form vertices of a triangular lattice. A plurality of first Schottky contacts are formed between the anode electrode and portions of the semiconductor substrate located inside the trenches, and a plurality of second Schottky contacts are formed between the anode electrode and portions of the semiconductor substrate located outside the trenches.

It is preferable that an internal diameter $r1$ of the trenches satisfy a relationship of $r1 \leq$ about 10 $\mu$m.

It is preferable that a length $L1$ of each side of a triangular unit of the triangular lattice satisfies a relationship of $r1+Wt \leq L1 \leq$ about 20 $\mu$m, where $Wt$ is a width of the trenches and $r1$ is an internal diameter of the trenches.

Preferably, the width $Wt$ of the trenches satisfies a relationship of $Wt \leq$ about 2 $\mu$m.

Preferably, a length variation of the three sides of the triangular lattice unit is within about 20% of the length $L1$ of each side.

An edge layer having the second conductivity type is preferably formed in the surface layer of the semiconductor substrate under an outermost circumference of the anode electrode.

A width $Le$ of the edge layer preferably satisfies a relationship of $Le \geq r1+2\ Wt$.

Preferably, a diffusion depth $Xje$ of the edge layer satisfies a relationship of $Xje \geq Xjt$, where $Xjt$ is a depth of anode layers at the bottoms of the trenches.

A shortest distance $W1$ between the edge layer and a closest trench preferably satisfies a relationship of $W1 \geq L1$.

The conductive materials are polysilicon materials and the top ends of the polysilicon materials are higher than the surface layer of the semiconductor substrate.

The semiconductor device preferably comprises insulating films and polysilicon portions on the top corners of each of the trenches.

These, together with other aspects and advantages that will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 15(a) to 15(p) illustrate process diagrams showing a manufacturing method of the semiconductor device of FIG. 1(a);

FIGS. 16(a) to 16(n) illustrate process diagrams showing another manufacturing method of the semiconductor device of FIG. 1(a);

FIG. 17(*b*) is a plan view of trenches of conventional MPS diodes, wherein the trenches appear as stripes.

DETAILED DESCRIPTION OF THE PREFERRED EMBODIMENTS

Figure 1A:
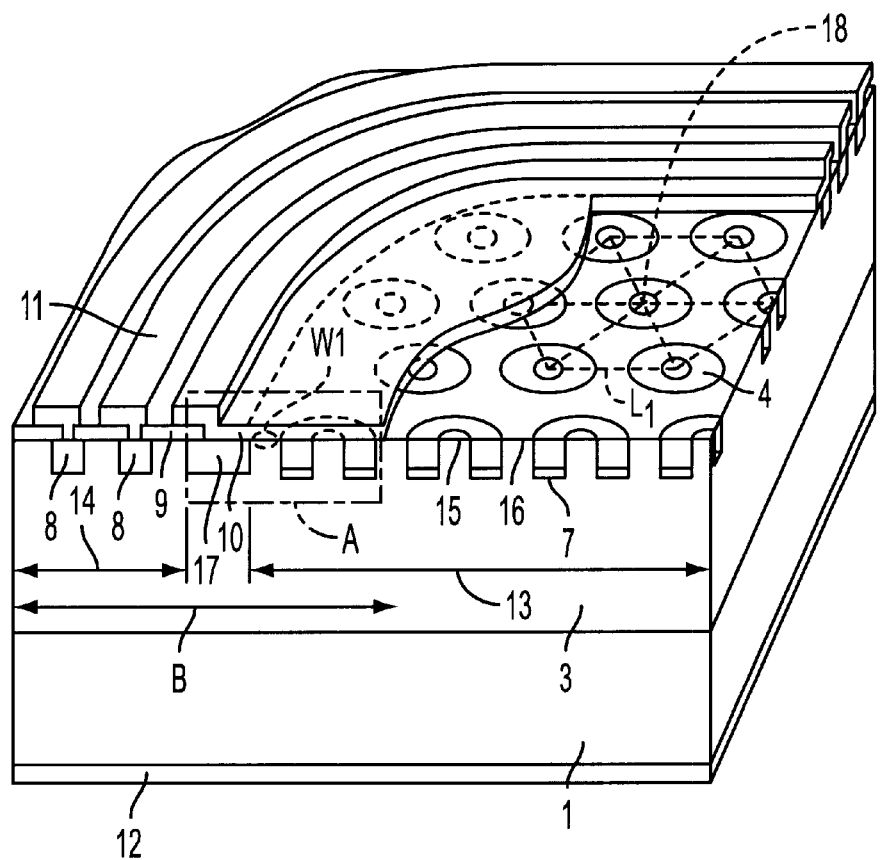
FIG. 1(a) is a perspective/sectional view of the main part of a semiconductor device according to a first embodiment of the present invention.

FIGS. 1(*a*) and 1(*b*) show a semiconductor device according to a first embodiment of the present invention. FIG. 1(*a*) is a perspective/sectional view of the main part of the semiconductor device and FIG. 1(*b*) is an enlarged view of part A of FIG. 1(*a*). In FIG. 1(*a*), part of an anode electrode 10 is removed to clearly show a plan shape and an arrangement of ring trenches 4 on a silicon surface.

To form this semiconductor device, an n⁻ drift layer 3 is formed on an n⁺ cathode layer 1 by epitaxial growth. An n-type intermediate layer having a higher impurity concentration than the drift layer 3 may also be formed between the n⁺ cathode layer 1 and the n⁻ drift layer 3 by epitaxial growth. Ring-shaped ring trenches 4 having a prescribed width are formed in the n⁻ drift layer 3, and oxide films 5 are formed on the side walls of the ring trenches 4 (no oxide films are formed on the bottom surfaces of the ring trenches 4). The ring trenches 4 are arranged such that straight lines connecting the centers 18 of adjacent ring trenches 4 form a triangular lattice (i.e., the centers 18 are located at triangular lattice points).

Figure 13A:
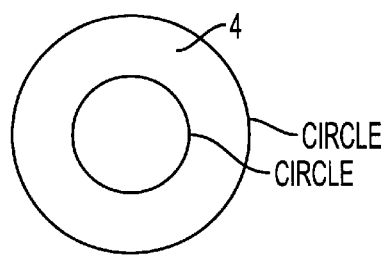
FIG. 13(a) is a plan view of circular trenches.
Figure 13B:
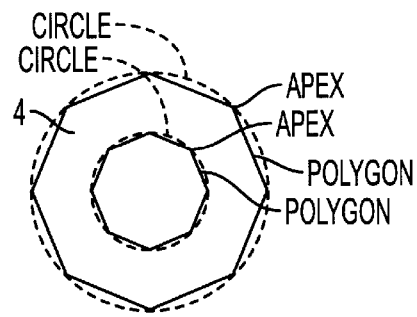
FIG. 13(b) is a plan view of polygonal trenches.

The trenches 4 may have either a circular plan shape (see FIG. 13(*a*)) or a polygonal plan shape (see FIG. 13(*b*)) in which apices are located on the circumference of circles at regular intervals. FIGS. 13(*a*) and 13(*b*) show only the ring trenches 4, that is, oxide films 5 are omitted.

Returning to FIG. 1, the ring trenches 4 are filled with polysilicon 6. The polysilicon portions 6 correspond to openings of the oxide film mask. Boron is implanted at 100 keV at a dose of $1\times10^{14}$ cm⁻², for example, and a heat treatment is performed, whereby p⁻ anode layers 7 are formed at the bottoms of the ring trenches 4. Then, anode electrode 10 is formed. Schottky contacts are formed at the interfaces between the anode electrode 10 and the n⁻ drift layer 3. The surfaces of the polysilicon portions 6 and the anode electrode 10 are in ohmic contact with each other. In this manner, a semiconductor rectifier having the MPS structure is formed in which the p⁻ anode layers 7 for pn junctions and the Schottky diode contacts are arranged parallel to one another.

The Schottky contacts comprise first Schottky contacts 15 that are formed inside the ring trenches 4 and have a circular plan shape, and second Schottky contacts 16 that are formed outside the ring trenches 4.

The details of the device will now be described. The depth of the ring trenches is about 3 μm, the width of the ring trenches is about 1 μm, the ring inner diameter (i.e., the diameter of inner circles of the trenches) is about 6 μm, the ring outer diameter (i.e., the diameter of outer circles of the trenches) is about 8 μm, the length L1 of one side of a triangular unit of the triangular lattice is about 12 μm, the diffusion depth of the anode layers 7 is about 0.7 μm, the concentration of the n⁻ drift layer 3 is about $1\times10^{14}$ cm⁻³, and the concentration of the cathode layer 1 is $1\times10^{18}$ cm⁻³. A p-type edge layer 17 is formed around a diode active region 13 having the pn junctions and the Schottky contacts, and a plurality of p⁺ layers 8 to serve as guard rings are formed around the p-type edge layer 17. Metal film 11 is a field plate. The p⁺ layers 8 and the metal films 11 form a voltage-withstanding structure 14. The junction depth of the p⁺ layers 8 is about 8 μm. The voltage-withstanding structure may be a field plate structure, a resurf structure, or any other structure appropriate.

Figure 1B:
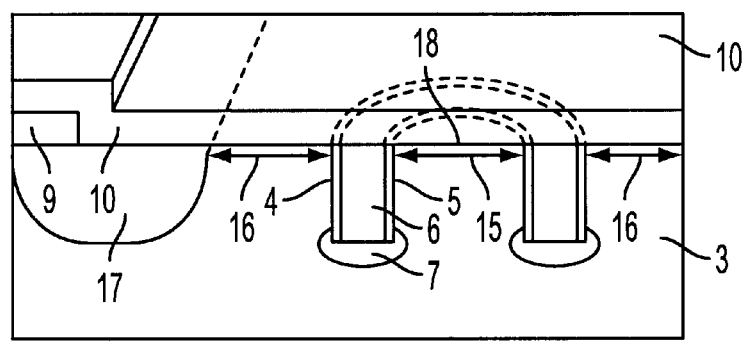
FIG. 1(b) is an enlarged view of part A of FIG. 1(a)
Figure 2A:
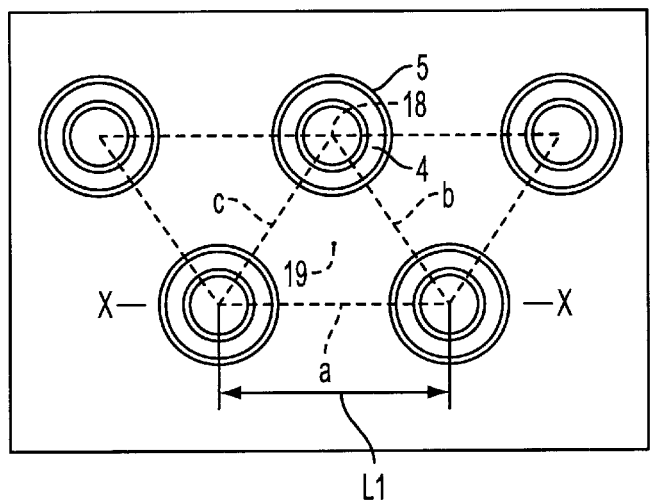
FIG. 2(a) is a plan view of an arrangement of ring trenches shown in FIGS. 1(a) and 1(b)
Figure 2B:
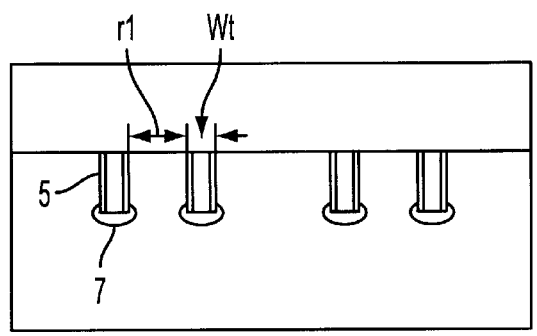
FIG. 2(b) is a sectional view taken along line X—X in FIG. 2(a)
Figure 2C:
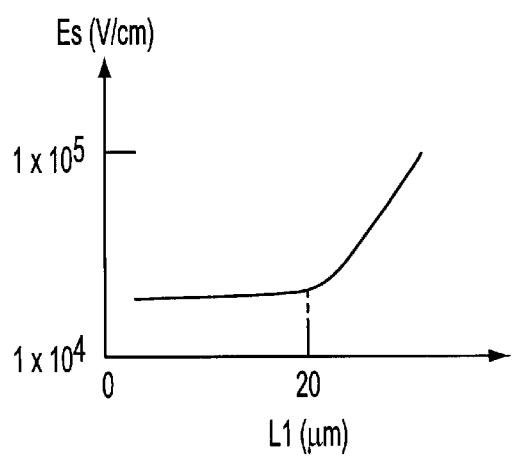
FIG. 2(c) is a graph showing a relationship between $L1$ and the electric field strength.

FIGS. 2(*a*) to 2(*c*) are diagrams showing an arrangement of the ring trenches 4 shown in FIGS. 1(*a*) and 1(*b*) and a graph of electric field strength, respectively. FIG. 2(*a*) is a partial plan view showing an arrangement of the ring trenches 4. FIG. 2(*b*) is a partial sectional view taken along line X—X in FIG. 2(*a*).

Referring to FIGS. 2(*a*) and 2(*b*), each unit of the triangular lattice is an equilateral triangle. The length of each side of the equilateral triangle is represented by L1. The inner diameter of the ring trenches 4 is represented by r1, and the trench width is represented by Wt. The outer diameter of the ring trenches 4 is given by r1+2 Wt. Symbols a, b, and c represent the lengths of respective sides of the equilateral triangle, which satisfy the relationship a=b=c=L1. FIG. 2(*c*) shows surface electric field strength under the above conditions.

FIG. 2(*c*) shows a relationship between the length L1 of the sides of the triangle and the maximum surface electric field strength Es of the Schottky portions. It can be seen that Es increases as L1 increases past 20 μm. This is because the depletion layer pinch-off effect diminishes as the length L1 of the sides of the triangle increases, even in the case where the ring trenches 4 are employed. It is therefore desirable that L1 be smaller than or equal to approximately 20 μm.

Figure 14:
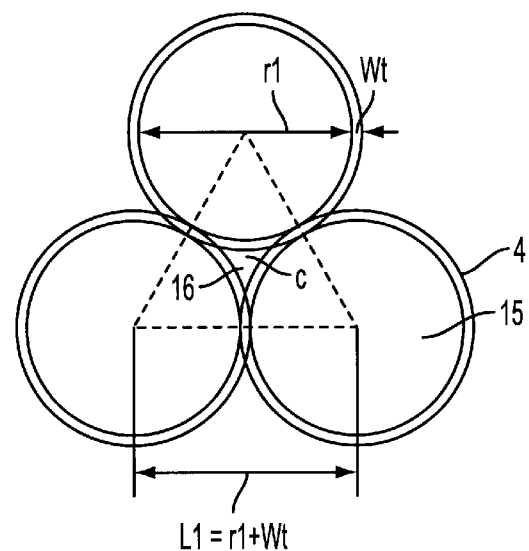
FIG. 14 is a diagram showing the ring trenches overlapping one another.
Figure 17A:
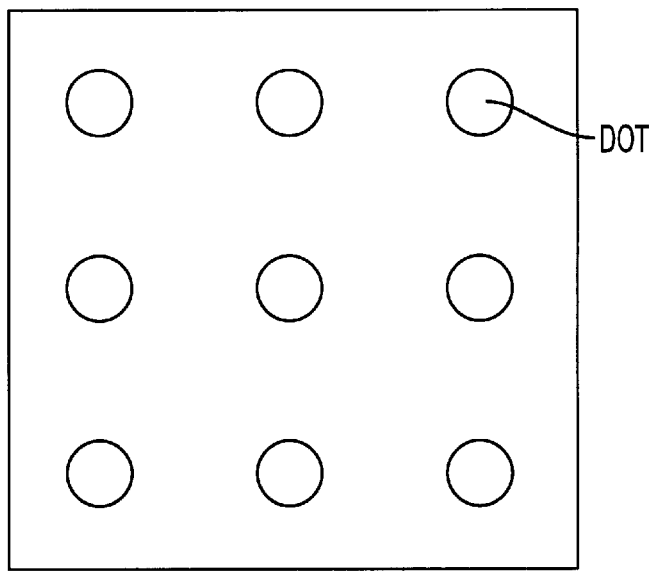
FIG. 17(*a*) is a plan view of trenches of conventional MPS diodes, wherein the trenches appear as dots.
Figure 17B:
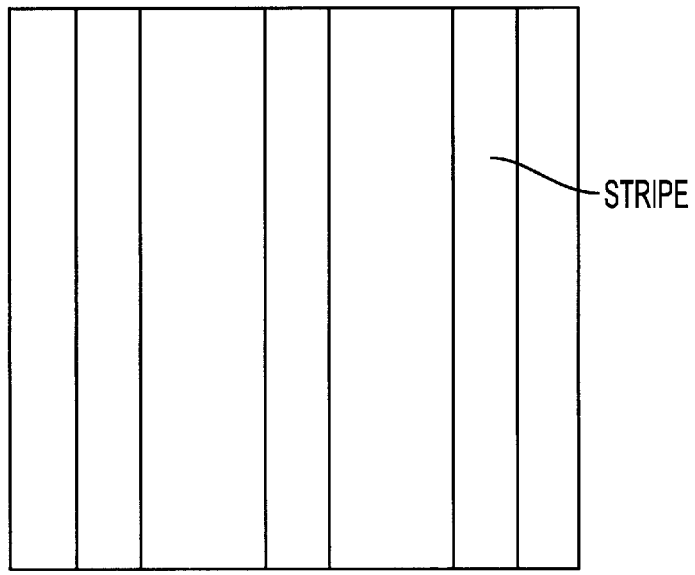

The lower limit of L1 corresponds to an arrangement wherein the ring trenches 4 overlap one another as shown in FIG. 14. In this case, the ring trenches 4 are formed such that the length L1 of one side of the triangle satisfies a relationship of r1+Wt≦L1≦about 20 μm.

When the ring trenches 4 overlap one another as shown in FIG. 14, the regions (i.e., regions C) occupied by the second Schottky contacts 16 are very small. Therefore, an arrangement is possible in which the second Schottky contacts 16 in the regions C in FIG. 14 are eliminated and parts of the ring trenches 4 are formed in these regions instead.

If the lengths a, b, and c of the respective sides of a triangular lattice unit vary to a large extent, deviating from an equilateral triangle, depletion layers extending from the respective ring trenches 4 no longer reach the center 18 of each triangle at the same time. Therefore, a large variation in triangle side lengths increases the leakage current and lowers the breakdown voltage. Thus, it is preferable to restrict the variation in the lengths of the respective sides to within approximately 20%.

FIGS. 3(*a*) and 3(*b*) show a device simulation result when a reverse voltage is applied to the semiconductor device of FIG. 1(*a*). FIG. 3(*a*) is a diagram showing an electric field strength profile of a ring trench 4 and FIG. 3(*b*) is a graph showing a relationship between r1 and the surface electric field strength Es.

A left-side part and a right-side part of a ring trench 4 in FIG. 3(*a*) correspond to the inside and the outside of the ring, respectively. As seen from FIG. 3(*a*), the electric field strength is very low inside the ring. This is because a depletion layer extends inwardly from the ring and, hence, the amount of space charge need not to be large. Therefore, the surface electric field strength becomes almost zero in the Schottky contact inside the ring, and the Schottky barrier lowering phenomenon does not occur in a reverse bias operation. Therefore, the leakage current can be reduced. By effectively setting the inner diameter r1 of the ring trench 4 and the length L1 of one side of the triangle, the area of the first Schottky contact 15 having a weak surface electric field can be increased and the Schottky area ratio (i.e., the Schottky ratio (Rsch) of Schottky contacts to pn junctions) can be made larger than in the conventional stripe structure and dot structure. As a result, the leakage current can be reduced.

Figure 3A:
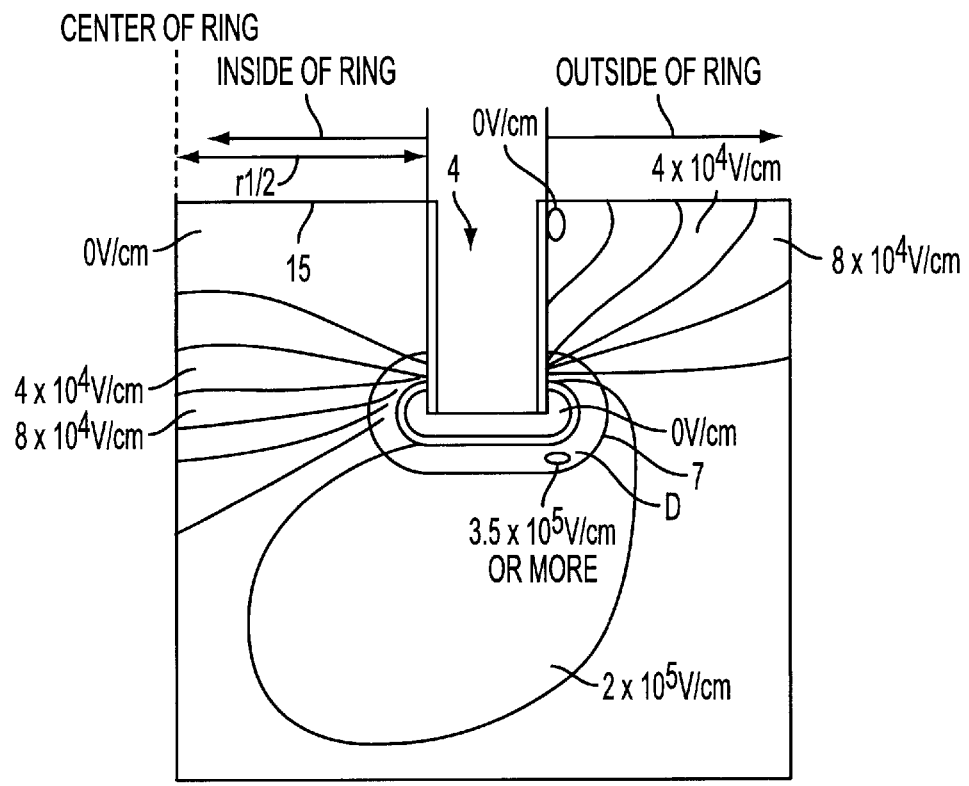
FIG. 3(a) is a diagram showing an electric field strength profile of a ring trench when a reverse voltage is applied to the semiconductor device of FIG. 1(a)
Figure 3B:
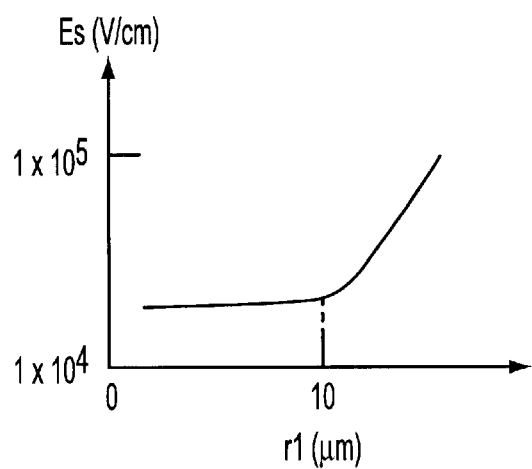
FIG. 3(b) is a graph showing a relationship between $r1$ and the surface electric field strength $Es$ when a reverse voltage is applied to the semiconductor device of FIG. 1(a)

FIG. 3(b) is a graph showing a relationship between the inner diameter r1 of the ring trenches 4 and the maximum surface electric field strength. It can be seen that the electric field strength can be made sufficiently low in an r1 range that is smaller than or equal to 10 μm. Therefore, it is desirable that r1 be smaller than or equal to approximately 10 μm and L1 be smaller than or equal to approximately 20 μm because the leakage current can be made sufficiently small under these conditions.

Figure 4A:
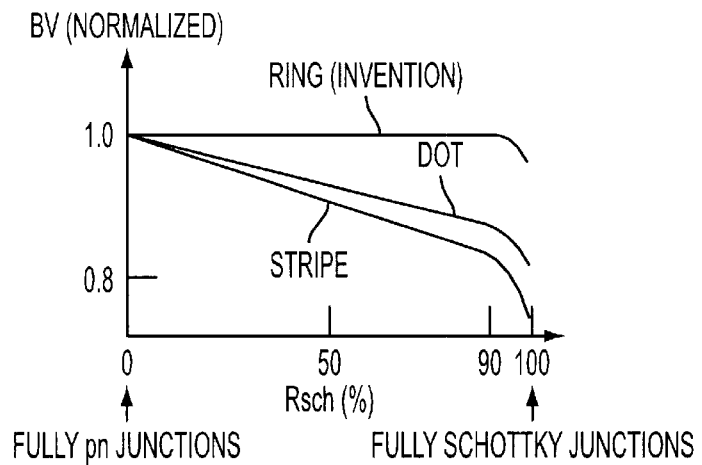
FIG. 4(a) is a graph showing a relationship between the element breakdown voltage BV and the Schottky ratio of the semiconductor device according to the invention of FIG. 1(a)
Figure 4B:
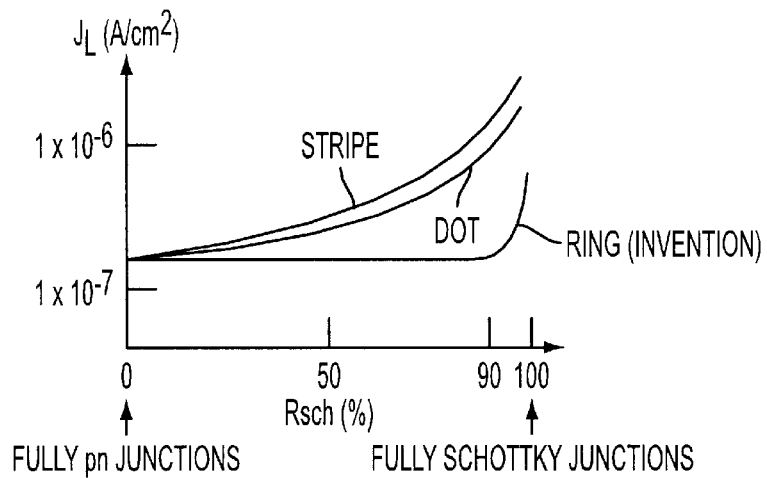
FIG. 4(b) is a graph showing a relationship between the leakage current $J_L$ and the Schottky ratio of the semiconductor device according to the invention of FIG. 1(a)

FIGS. 4(a) and 4(b) are graphs of an element breakdown voltage BV and a leakage current $J_L$ of the semiconductor device according to the invention of FIG. 1(a). FIG. 4(a) is a graph showing a relationship between the element breakdown voltage BV and the Schottky ratio Rsch and FIG. 4(b) is a graph showing a relationship between the leakage current $J_L$ and the Schottky ratio Rsch. Relationships of conventional devices having a stripe trench shape and a dot trench shape, respectively, are also shown for comparison.

As seen from FIG. 4(a), in contrast to conventional semiconductor devices (dot and stripe), the breakdown voltage of the semiconductor device having the ring trench structure according to the present invention is kept high, even if the Schottky ratio Rsch is increased. As described above, this is due to the manner of expansion of the depletion layer inside the ring, that is, reduction in electric field strength in a portion D of the p⁻ anode layer 7 at the bottom of the ring trench 4, as shown in FIG. 3(a).

It can be seen from FIG. 4(b) that the leakage current is reduced to a large extent in the semiconductor device having the ring trench structure according to the present invention because the electric field strength is reduced as described above with reference to FIG. 4(a).

Figure 5:
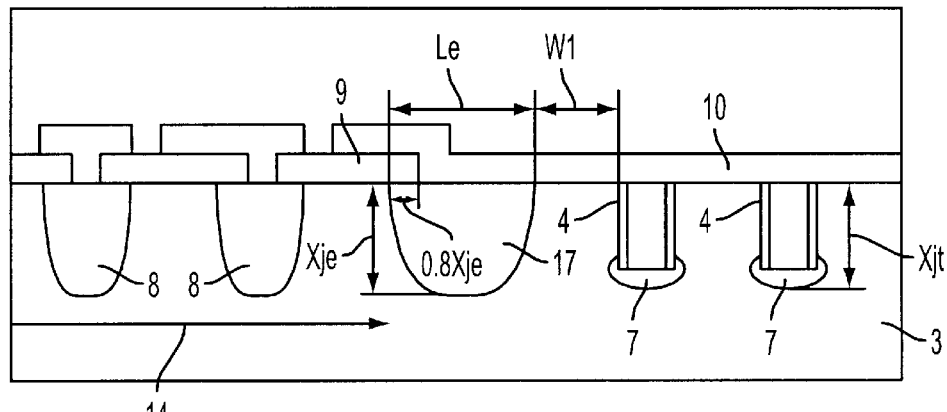
FIG. 5 is an enlarged sectional view of part B of FIG. 1(a)

FIG. 5 is an enlarged sectional view of part B of FIG. 1(a). The width of the p-type edge layer 17 is represented by Le, the shortest distance between the p-type edge layer 17 and the ring trench 4 closest to it is represented by W1, the diffusion depth of the p-type edge layer 17 is represented by Xje, and the depth from the surface (i.e., the surface of the n⁻ drift layer 3) of the p⁻ anode layer 7 that is formed at the bottom of each ring trench 4 is represented by Xjt. The lateral diffusion length in the surface of the p-type edge layer 17 from the end of an insulating film 9, which serves as a mask in ion implantation for formation of the p-type edge layer 17, is equal to about 0.8 Xje. Next, the device breakdown voltage BV will be described with reference to FIGS. 5–8.

Figure 6:
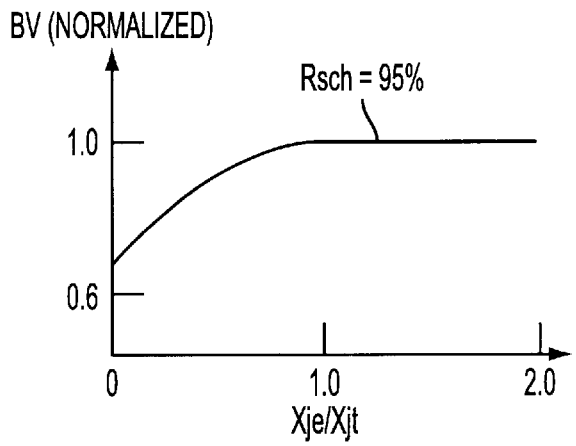
FIG. 6 is a graph showing a correlation between the ratio of the depth $Xje$ of the p-type edge layer to the depth $Xjt$ of the p⁻ anode layers at the bottoms of the trenches, and the element breakdown voltage BV.

FIG. 6 is a graph showing a correlation between the ratio of the depth Xje of the p-type edge layer 17 to the depth Xjt of the p⁻ anode layers 7 at the bottoms of the trenches 4, and the element breakdown voltage BV. The vertical axis is normalized by a maximum breakdown voltage that is obtained when Rsch=95%. The breakdown voltage becomes low when the depth Xje of the p-type edge layer 17 becomes smaller than the depth Xjt of the p⁻ anode layers 7 at the bottoms of the trenches 4 (Xje/Xjt<1). This is because the electric field strength in the p⁻ anode layers 7 of the outermost ring trenches 4 becomes higher than that in the p⁻ anode layers 7 of the ring trenches 4 located at the other positions and avalanche multiplication occurs there. Therefore, it is desirable that the depth Xje of the p-type edge layer 17 be greater than the depth Xjt of the p⁻ anode layers 7.

Figure 7:
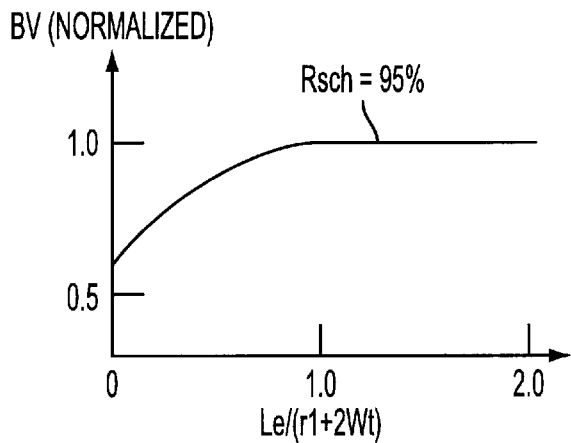
FIG. 7 shows a relationship between the ratio of the width $Le$ of the p-type edge layer to the outer diameter ($r1+2\ Wt$) of the ring trenches, and the element breakdown voltage BV.

FIG. 7 shows a characteristic of the element breakdown voltage BV with reference to the relationship between the ratio of the width Le of the p-type edge layer 17 to the outer diameter (r1+2 Wt) of the ring trenches 4. The element breakdown voltage BV is normalized by a maximum breakdown voltage that is obtained when the Schottky ratio Rsch=95%. The shortest distance W1 between the p-type edge layer 17 and the outermost ring trenches 4 is set equal to L1 and Xje is set equal to Xjt. When the width Le of the p-type edge layer 17 becomes smaller than the outer diameter (r1+2 Wt) of the ring trenches 4, the depletion layers expand and become non-uniform, resulting in a decrease of the element breakdown voltage. Therefore, it is desirable that Le be greater than the outer diameter of the ring trenches 4.

Figure 8:
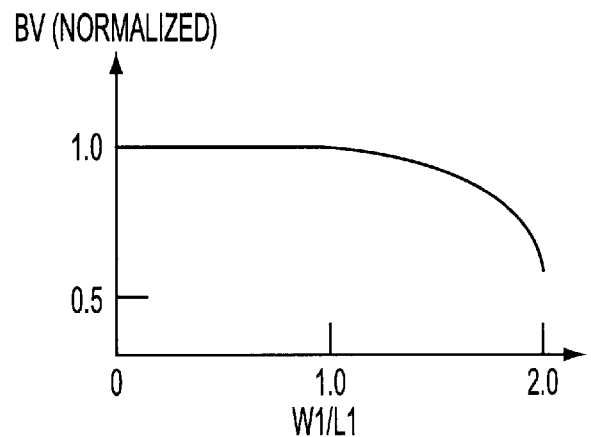
FIG. 8 is a graph showing a relationship between the ratio of the shortest distance $W1$ between the edge layer and the outermost ring trenches to the length $L1$ of one side of a triangular lattice unit, and the element breakdown voltage BV.

FIG. 8 is a graph showing a relationship between the ratio of the shortest distance W1 between the edge layer 17 and the outermost ring trenches 4 to the length L1 of one side of the triangular lattice unit, and the element breakdown voltage BV. The element breakdown voltage BV is normalized by a maximum breakdown voltage that is obtained when Rsch=95% and Xje=Xjt. The breakdown voltage decreases when W1 becomes longer than L1. This is because the electric field weakening effect by the edge layer 17 diminishes and the electric field strength in the p⁻ anode layers 7 at the bottoms of the outermost trenches 4 becomes higher than that in the p⁻ anode layers 7 at the bottoms of the other trenches 4 (trenches other than the outermost trenches), resulting in avalanche multiplication. Therefore, it is preferable that W1 be set to satisfy a relationship of W1≦L1.

Figure 9:
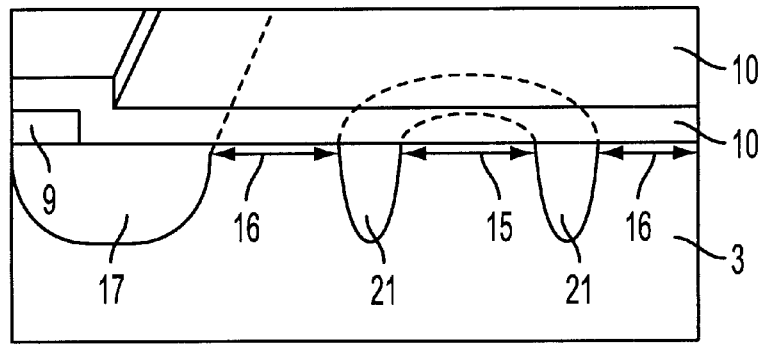
FIG. 9 is a perspective/sectional view of the main part of a semiconductor device according to a second embodiment of the invention.

FIG. 9 is a perspective/sectional view of the main part of a semiconductor device according to a second embodiment of the invention. FIG. 9 corresponds to FIG. 1(b). Ring-shaped p-type emitter layers 21 (ring cells) that correspond to the ring trenches 4 shown in FIGS. 1(a) and 1(b) are formed in a substrate surface layer (i.e., a surface layer of the n⁻ drift layer 3) on the anode electrode 10 side at positions forming a triangular lattice. Schottky contacts 15 and 16 are formed inside and outside, respectively, of the ring-shaped p-type emitter layers 21 similar to that shown in FIGS. 1(a) and 1(b). The ring cells 21 may contact or overlap one another. The p-type emitter layers 21 are formed by ion implantation, thermal diffusion, etc. The semiconductor device according to the second embodiment of the invention provides the same advantages as the device of FIGS. 1(a) and 1(b).

Figure 10:
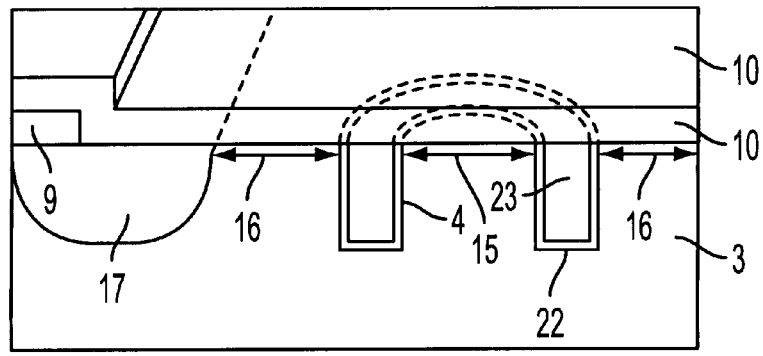
FIG. 10 is a perspective/sectional view of the main part of a semiconductor device according to a third embodiment of the invention.

FIG. 10 is a perspective/sectional view of the main part of a semiconductor device according to a third embodiment of the invention. FIG. 10 corresponds to FIG. 1(b). Ring trenches 4 are formed in a substrate surface layer (i.e., a surface layer of the n⁻ drift layer 3) on the side adjacent to the anode electrode 10 at positions forming a triangular lattice. The internal surfaces of each ring trench 4 are covered with an oxide film 22 and the internal space 23 is filled with low-resistivity polysilicon or a metal. The polysilicon portions or the metal portions are in contact with the anode electrode 10. This kind of structure is known as a TMBS (trench-MOS-barrier-Schottky) structure. The employment of the ring trenches 4 reduces the electric field strength of the Schottky contacts 15 and 16 and the area in the vicinity of the bottoms of the trenches 4. The semiconductor device according to the third embodiment of the invention provides the same advantages as the device of FIGS. 1(a) and 1(b).

Figure 11:
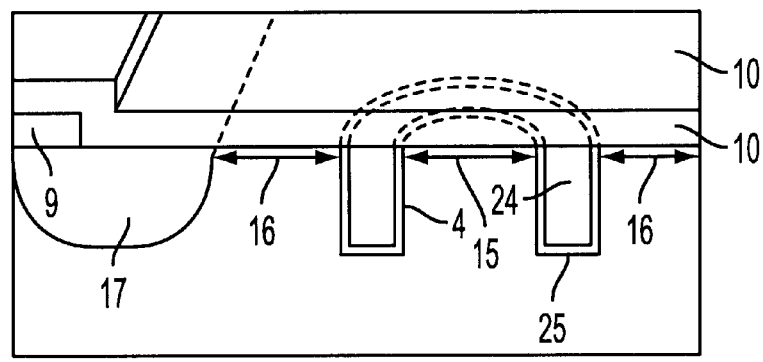
FIG. 11 is a perspective/sectional view of the main part of a semiconductor device according to a fourth embodiment of the invention.

FIG. 11 is a perspective/sectional view of the main part of a semiconductor device according to a fourth embodiment of the invention. FIG. 11 corresponds to FIG. 1(b). Ring trenches 4 are formed in a substrate surface layer (i.e., a surface layer of the n⁻ drift layer 3) on the side adjacent to the anode electrode 10 at positions forming a triangular lattice. A p-type layer 25 is formed at the bottom and the side surfaces of each ring trench 4. The internal spaces 24 of ring trenches 4 are filled with low-resistivity polysilicon or a metal. The polysilicon portions or the metal portions are in contact with the anode electrode 10. Also, in this embodiment of the present invention, the electric field strength of the Schottky contacts 15 and 16 and the area in the vicinity of the bottoms of the trenches 4 can be reduced. The semiconductor device according to the fourth embodiment of the invention provides the same advantages as the device of FIGS. 1(*a*) and 1(*b*).

In the above-described first through fourth embodiments, the Schottky contacts 15 and 16 are in Schottky contact with the anode electrode 10, which is made of pure aluminum, for example. Alternatively, Schottky contact may be attained by forming a very thin (about 10 nm) p⁻ layer at the interface between the silicon substrate (i.e., the n⁻ drift layer 3) and the anode electrode 10 by adhering, to the silicon substrate, aluminum having a very small amount (about 1%) of silicon (Al-Si), and then performing a heat treatment. Accordingly, when the p⁻ layer is formed, the Schottky barrier breakdown voltage becomes higher by about 10% and the leakage current can be made smaller than it can using pure aluminum.

Figure 12A:
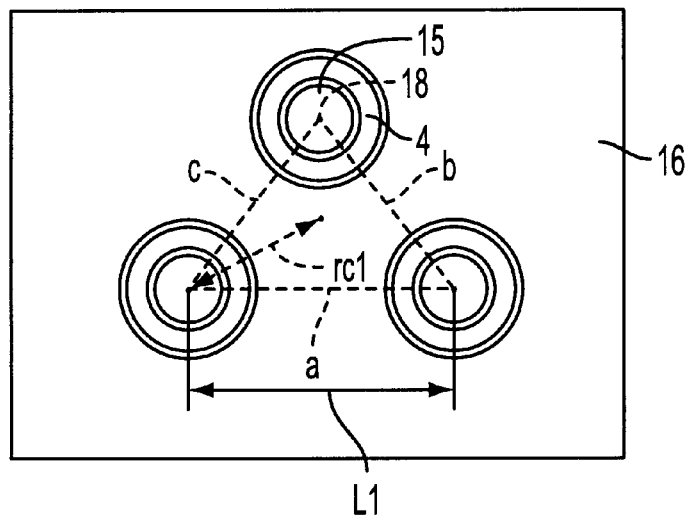
FIG. 12(a) shows a distance between each lattice point of a triangular lattice and the center of a region surrounded by the lattice points (a maximum distance between rings)
Figure 12B:
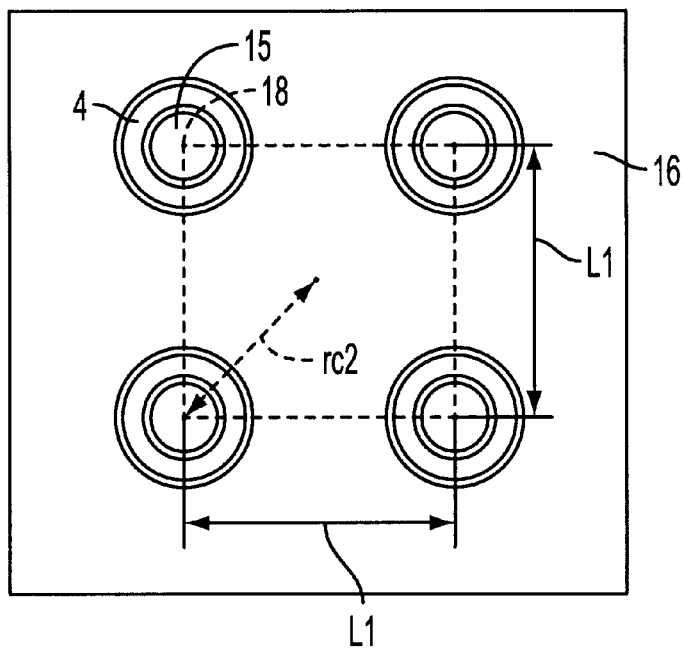
FIG. 12(b) shows a distance between each lattice point of a square lattice and the center of a region surrounded by the lattice points (a maximum distance between rings)

FIGS. 12(*a*) and 12(*b*) are diagrams for comparing triangular and square lattices. FIG. 12(*a*) shows a distance rc1 from a lattice point to the center of a region defined by the lattice points (i.e., a maximum distance between rings) in a triangular lattice. FIG. 12(*b*) shows a distance rc2 from a lattice point to the center of a region defined by the lattice points (i.e., a maximum distance between rings) in a square lattice. With the same pitch (length L1 of one side of a triangular or square lattice unit), the square lattice has a maximum distance rc2 between rings of 0.707L1 and the triangular lattice has a maximum distance rc1 between rings of 0.577L1. Because rc1 is smaller, the triangular lattice allows depletion pinch-off to occur effectively in a reverse bias operation and, hence, can reduce the electric field strength. Therefore, arranging circular rings in a triangular lattice is preferable to arranging the rings in a square lattice.

As described in each of the first through fourth embodiments, the invention can provide a semiconductor device that has a high breakdown voltage and a small leakage current, high speed, low loss, and soft recovery, while having a large Schottky ratio.

A power module, an IPM (intelligent power module), or the like that is small in heat generation loss and electromagnetic noise can be provided using the semiconductor device according to the invention.

Next, a manufacturing method of the semiconductor device having the structure of FIGS. 1(*a*) and 1(*b*) will be described with reference to FIGS. 15(*a*) to 15(*p*), which are sectional views of the main part of the semiconductor device showing respective manufacturing operations.

First, an approximately 0.8-μm oxide film 32 is formed on the surface of a semiconductor substrate 31, as shown in FIG. 15(*a*). Then, part of the oxide film 32 is removed to form a window and boron is ion-implanted, forming a p-type edge layer 17. A left-side part and a right-side part of the structure shown in FIG. 15(*a*) will become edge terminations for high blocking voltage and an active region, respectively. Only part of the oxide film 32 that is located in the active region is removed, and an approximately 0.8-μm oxide film 33 is formed thereafter (see FIG. 15(*b*)). Then, part of the oxide film 33 is removed and trench etching is performed using the oxide film 33 as a mask to form an approximately 3-μm deep ring trench 4 (see FIG. 15(*c*)).

If the top corners of the trench 4 of the semiconductor substrate 31 are given an obtuse angle by the trench etching, defects there will increase the leakage current. It is therefore preferable that each operation be such as to give the top corners of the trench 4 approximately a right angle. That is, in the trench etching, etching is performed while oxide films are formed on the side walls of the trench 4 by introducing a very small amount of oxygen into an etching gas. The oxide films that are formed on the side walls of the trench 4 suppress lateral etching of the trench 4. Then, the oxide films that are formed on the side walls of the trench 4 are removed and round etching is performed so that the trench assumes a desired shape.

Next, sacrificial oxidation is performed to smooth out the surfaces of the side walls of the thus-formed trench 4, whereby an approximately 0.1-μm oxide film 34 is formed in the trench 4 (see FIG. 15(*d*)). Then, boron is ion-implanted under conditions of approximately $1 \times 10^{15}$ cm⁻² (dose) and 45 keV (see FIG. 15(*e*)), and annealing is performed at approximately 1,000° C. for 30 minutes to form a p⁻ anode layer 7 at the bottom of the trench 4 (see FIG. 15(*f*)). Then, the sacrificial oxide film 34 is removed (at this time, the surface oxide film has a thickness of about 0.5–0.6 μm). See FIG. 15(*g*). An approximately 0.2-μm oxide film 35 is formed by growth of a thermal oxide film or deposited oxide film (see FIG. 15(*h*)), and only part of the oxide film that is located at the bottom of the trench 4 is removed by anisotropic etching (at this time, the surface oxide film has a thickness of about 0.2–0.3 μm). See FIG. 15(*i*).

Then, polysilicon 36 of about 0.5–1 μm in thickness is grown on the entire surface of the semiconductor substrate to fill in the trench 4 (see FIG. 15(*j*)). Boron is ion-implanted over the entire surface under conditions of about $1 \times 10^{15}$ cm⁻² (dose) and 45 keV and annealing is performed at 1,000° C. for 30 minutes, whereby the impurity is diffused through the polysilicon layer 36 to decrease its resistivity (see FIG. 15(*k*)). Then, a resist is applied and only a resist 37 that is located on the top of the trench 4 remains. The polysilicon layer 36 is etched using the resist 37 as a mask (see FIG. 15(*l*)).

At this time, a measurement is taken to leave a polysilicon portion that is wider than the trench 4 (including the oxide films formed on the side walls). Then, the resist 37 on the polysilicon portion is removed (see FIG. 15(*m*)). A phosphosilicate glass (PSG) film 38 is grown and part of the PSG film 38 in the active portion is removed by dry etching so that the other part of the PSG film 38 remains only in the outer circumference edge termination structure of the chip (see FIG. 15(*n*)). The reason why dry etching is used for removing the PSG film is to leave the oxide films in desired form. If wet etching were employed, an etching liquid would soak into $SiO_2$ (i.e., the oxide film of 0.2–0.3 μm in thickness) between the polysilicon portion 36 and the mesa silicon layer and the oxide films under the polysilicon portion 36 that should be left would be etched away, resulting in the semiconductor substrate contacting the polysilicon portion to increase the leakage current. That is, the leakage current is reduced by leaving, at the top corner of the trench 4, the oxide films and polysilicon portions in visor form.

Subsequently, a heat treatment is performed at approximately 950° C. for 30 minutes in an atmosphere that is composed of $N_2$ and a very small amount of $O_2$. This is to eliminate, by performing the heat treatment, etching damage defects that were formed when the PSG film 38 was subjected to dry etching, and to remain in the Schottky portions on the mesa top surface. Then, after the remaining $SiO_2$ films (remaining oxide films) on the mesa portion are removed by HF (hydrofluoric acid), a metal (Al-Si) film 39, which will become an anode electrode, is sputtered onto the semiconductor substrate (see FIG. 15(*o*)). Finally, a silicon nitride film 40 is formed on the surface (see FIG. 15(*p*)).

Next, another manufacturing method will be described with reference to FIGS. 16(*a*) to 16(*n*), which are sectional views of the main part of the semiconductor device showing respective manufacturing operations for the semiconductor device.

The process of FIGS. 16(*a*) to 16(*n*) differs from that of FIGS. 15(*a*) to 15(*p*) as follows. After execution of the operation of FIG. 15(*c*), the formation of a sacrificial oxide film (FIG. 15(*d*)) is not performed and the formation of a thermal oxide film or a gate oxide film (FIG. 15(*h*)) is performed as an operation of FIG. 16(*d*). The oxide film at the bottom of the trench 4 is removed in FIG. 16(*e*) as in FIG. 15(*i*). Then, boron is ion-implanted under conditions of about $1 \times 10^{15}$ $cm^{-2}$ (dose) and 45 keV in FIG. 16(*f*), and polysilicon 36 is grown at a thickness of about 0.5–1 μm over the entire surface of the semiconductor substrate in FIG. 16(*g*). A $p^-$ anode layer 7 is formed by performing annealing at approximately 1,000° C. for 30 minutes in FIG. 16(*h*). The operations in FIGS. 16(*i*) to 16(*m*) are the same as those in FIGS. 15(*k*) to 15(*p*).

By forming Schottky contacts in portions enclosed by the inner circles of the rings of ring trenches or ring emitter layers that are arranged so that straight lines connecting the centers form a triangular lattice, the present invention can provide a high-speed, soft-recovery semiconductor device having a large Schottky ratio and a small leakage current.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A semiconductor device comprising:
   a semiconductor substrate having a first major surface, an opposing second major surface, and a first conductivity type;
   an anode electrode formed on the first major surface of the semiconductor substrate;
   a plurality of Schottky contacts between the anode electrode and the semiconductor substrate;
   a cathode region formed on a surface layer of the second major surface of the semiconductor substrate;
   a cathode electrode formed on the cathode region on a side of the cathode region opposite the second major surface of the semiconductor substrate;
   a plurality of ring-shaped trenches, in a surface layer of the first major surface of the semiconductor substrate, having a prescribed width;
   a plurality of first Schottky contacts between the anode electrode and portions of the semiconductor substrate that are located inside the trenches;
   a plurality of second Schottky contacts between the anode electrode and portions of the semiconductor substrate that are located outside the trenches;
   insulating films formed on side walls of the trenches;
   first semiconductor regions having a second conductivity type and contacting bottoms of the trenches; and
   conductive materials filling the trenches and electrically connecting the first semiconductor regions to the anode electrode.

2. The semiconductor device according to claim 1, wherein an internal diameter r1 of the trenches satisfies a relationship of $r1 \leq$ about 10 μm.

3. The semiconductor device according to claim 2, wherein straight lines connecting centers inside the trenches adjacent to one another form a triangular lattice, and a length L1 of each side of a triangular unit of the triangular lattice satisfies a relationship of $r1 + Wt \leq L1 \leq$ about 20 μm, where Wt is a width of the trenches and r1 is an internal diameter of the trenches.

4. The semiconductor device according to claim 3, wherein a width Wt of the trenches satisfies the relationship of $Wt \leq$ about 2 μm.

5. The semiconductor device according to claim 2, wherein a width Wt of the trenches satisfies a relationship of $Wt \leq$ about 2 μm.

6. The semiconductor device according to claim 1, wherein straight lines connecting centers inside the trenches adjacent to one another form a triangular lattice, and a length L1 of each side of a triangular unit of the triangular lattice satisfies a relationship of $r1 + Wt \leq L1 \leq$ about 20 μm, where Wt is a width of the trenches.

7. The semiconductor device according to claim 6, wherein a width Wt of the trenches satisfies the relationship of $Wt \leq$ about 2 μm.

8. The semiconductor device according to claim 6, wherein straight lines connecting centers inside the trenches adjacent to one another form a triangular lattice, and a length deviation of each of the three sides of the triangular lattice unit is within about 20% of the length L1.

9. The semiconductor device according to claim 1, wherein a width Wt of the trenches satisfies a relationship of $Wt \leq$ about 2 μm.

10. The semiconductor device according to claim 1, further comprising an edge layer having the second conductivity type that is formed in the surface layer of the first major surface of the semiconductor substrate under an outermost circumference of the anode electrode.

11. The semiconductor device according to claim 10, wherein a width Le of the edge layer satisfies a relationship of $Le \geq r1 + 2\,Wt$, where r1 is an internal diameter of the trenches and Wt is a width of the trenches.

12. The semiconductor device according to claim 11, wherein a diffusion depth Xje of the edge layer satisfies a relationship of $Xje \geq Xjt$, where Xjt is a depth of anode layers at the bottoms of the trenches.

13. The semiconductor device according to claim 12, wherein straight lines connecting centers inside the trenches adjacent to one another form a triangular lattice, and a shortest distance W1 between an edge of the edge layer and a closest trench satisfies a relationship of $W1 \leq L1$, where L1 is a length of one side of a triangular unit of the triangular lattice.

14. The semiconductor device according to claim 11, wherein straight lines connecting centers inside the trenches adjacent to one another form a triangular lattice, and a shortest distance W1 between an edge of the edge layer and a closest trench satisfies a relationship of $W1 \leq L1$, where L1 is a length of one side of a triangular unit of the triangular lattice.

15. The semiconductor device according to claim 10, wherein a diffusion depth Xje of the edge layer satisfies a relationship of Xje≧Xjt, where Xjt is a depth of anode layers at the bottoms of the trenches.

16. The semiconductor device according claim 15, wherein straight lines connecting centers inside the trenches adjacent to one another form a triangular lattice, and a shortest distance W1 between an edge of the edge layer and a closest trench satisfies a relationship of W1≦L1 where L1 is a length of one side of a triangular unit of the triangular lattice.

17. The semiconductor device according to claim 10, wherein straight lines connecting centers inside the trenches adjacent to one another form a triangular lattice, and a shortest distance W1 between an edge of the edge layer and a closest trench satisfies a relationship of W1≦L1, where L1 is a length of one side of a triangular unit of the triangular lattice.

18. The semiconductor device according to claim 1, wherein the conductive materials are polysilicon materials and top ends of the polysilicon materials in the trenches are higher than the first major surface of the semiconductor substrate.

19. The semiconductor device according to claim 18, further comprising an insulating film and a polysilicon portion at top corners of each of the trenches.

20. A semiconductor device comprising:
a semiconductor substrate having a first major surface, an opposing second major surface, and a first conductivity type;
an anode electrode formed on the first major surface of the semiconductor substrate;
a plurality of Schottky contacts between the anode electrode and the semiconductor substrate;
a cathode region formed on a surface layer of the second major surface of the semiconductor substrate;
a cathode electrode formed on the cathode region on a side of the cathode region opposite the second major surface of the semiconductor substrate;
a plurality of ring-shaped trenches, in a surface layer of the first major surface of the semiconductor substrate, having a prescribed width;
a plurality of first Schottky contacts between the anode electrode and portions of the semiconductor substrate that are located inside the trenches;
a plurality of second Schottky contacts between the anode electrode and portions of the semiconductor substrate that are located outside the trenches;
insulating films that are formed on side walls and bottoms of the trenches; and
conductive materials that fill the trenches and are electrically connected to the anode electrode.

21. A semiconductor device comprising:
a semiconductor substrate having a first major surface, an opposing second major surface, and a first conductivity type;
an anode electrode formed on the first major surface of the semiconductor substrate;
a plurality of Schottky contacts between the anode electrode and the semiconductor substrate;
a cathode region formed on a surface layer of the second major surface of the semiconductor substrate;
a cathode electrode formed on the cathode region on a side of the cathode region opposite the second major surface of the semiconductor substrate;
a plurality of ring-shaped trenches, in a surface layer of the first major surface of the semiconductor substrate, having a prescribed width;
a plurality of first Schottky contacts between the anode electrode and portions of the semiconductor substrate that are located inside the trenches;
a plurality of second Schottky contacts between the anode electrode and portions of the semiconductor substrate that are located outside the trenches;
semiconductor regions that have a second conductivity type and are formed on side walls and bottoms of the trenches; and
conductive materials that fill the trenches and are electrically connected to the anode electrode.

22. A semiconductor device comprising:
a semiconductor substrate having a first major surface, an opposing second major surface, and a first conductivity type;
an anode electrode formed on the first major surface of the semiconductor substrate;
a plurality of Schottky contacts between the anode electrode and the semiconductor substrate;
a cathode region formed on a surface layer of the second major surface of the semiconductor substrate;
a cathode electrode formed on the cathode region on a side of the cathode region opposite the second major surface of the semiconductor substrate;
ring-shaped semiconductor regions, in a surface layer of the first major surface of the semiconductor substrate, having a prescribed width and a second conductivity type;
first Schottky contacts between the anode electrode and portions of the semiconductor substrate that are located inside internal circles of the ring-shaped semiconductor regions; and
second Schottky contacts between the anode electrode and portions of the semiconductor substrate that are located outside outer circles of the ring-shaped semiconductor regions.

23. A semiconductor device, comprising:
a semiconductor substrate;
an anode electrode formed on one surface of the semiconductor substrate;
a plurality of ring-shaped trenches formed in the one surface of the semiconductor substrate, wherein centers, on the one surface of the semiconductor substrate, of each of the trenches form vertices of a triangular lattice;
a plurality of first Schottky contacts between the anode electrode and portions of the semiconductor substrate located inside the trenches;
a plurality of second Schottky contacts between the anode electrode and portions of the semiconductor substrate located outside the trenches; and
semiconductor regions, having a conductivity type different from a conductivity type of the semiconductor substrate, and contacting bottoms of the trenches.

24. A method of forming a semiconductor device, comprising:
forming an anode electrode on one surface of a semiconductor substrate;
forming a plurality of ring-shaped trenches in the one surface of the semiconductor substrate, wherein centers, on the one surface of the semiconductor substrate, of each of the trenches form vertices of a triangular lattice;

forming a plurality of first Schottky contacts between the anode electrode and portions of the semiconductor substrate located inside the trenches;

forming a plurality of second Schottky contacts between the anode electrode and portions of the semiconductor substrate located outside the trenches; and forming semiconductor regions, having a conductivity type different from a conductivity type of the semiconductor substrate, and contacting bottoms of the trenches.

25. A semiconductor device comprising:

a semiconductor substrate having a first major surface, an opposing second major surface, and a first conductivity type;

an anode electrode formed on the first major surface of the semiconductor substrate;

a plurality of Schottky contacts between the anode electrode and the semiconductor substrate;

a cathode region formed on a surface layer of the second major surface of the semiconductor substrate;

a cathode electrode formed on the cathode region on a side of the cathode region opposite the second major surface of the semiconductor substrate;

a plurality of ring-shaped trenches, in a surface layer of the first major surface of the semiconductor substrate, having a prescribed width;

a plurality of first Schottky contacts between the anode electrode and portions of the semiconductor substrate that are located inside the trenches;

a plurality of second Schottky contacts between the anode electrode and portions of the semiconductor substrate that are located outside the trenches;

first semiconductor regions having a second conductivity type and contacting bottoms of the trenches; and conductive materials filling the trenches and electrically connecting the first semiconductor regions to the anode electrode.

* * * * *

UNITED STATES PATENT AND TRADEMARK OFFICE
CERTIFICATE OF CORRECTION

PATENT NO. : 6,670,650 B2
DATED : December 30, 2003
INVENTOR(S) : Michio Nemoto et al.

It is certified that error appears in the above-identified patent and that said Letters Patent is hereby corrected as shown below:

<u>Title page,</u>
Item [56], FOREIGN PATENT DOCUMENTS, change
"JP     30-031271     2/1985" to -- JP     60-031271     2/1985 --.

Signed and Sealed this

Thirtieth Day of March, 2004

JON W. DUDAS
*Acting Director of the United States Patent and Trademark Office*